US009459687B2

(12) United States Patent
Park et al.

(10) Patent No.: US 9,459,687 B2
(45) Date of Patent: Oct. 4, 2016

(54) STORAGE SYSTEMS AND UFS SYSTEMS CONFIGURED TO CHANGE INTERFACE IDLE MODE TO ACTIVE STATE BASED ON ESTIMATED TIME TO EXECUTE AT LEAST ONE OPERATION

(71) Applicants: Jeong-Woo Park, Suwon-si (KR); Sangyoon Oh, Suwon-si (KR)

(72) Inventors: Jeong-Woo Park, Suwon-si (KR); Sangyoon Oh, Suwon-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 90 days.

(21) Appl. No.: 14/300,495

(22) Filed: Jun. 10, 2014

(65) Prior Publication Data

US 2015/0012671 A1 Jan. 8, 2015

(30) Foreign Application Priority Data

Jul. 8, 2013 (KR) ........................ 10-2013-0079847

(51) Int. Cl.
*G06F 1/32* (2006.01)
*G06F 3/06* (2006.01)
*G06F 13/00* (2006.01)
*G11C 16/00* (2006.01)

(52) U.S. Cl.
CPC .......... *G06F 1/3268* (2013.01); *G06F 3/0625* (2013.01); *G06F 3/0634* (2013.01); *G06F 3/0659* (2013.01); *G06F 3/0688* (2013.01); *G06F 13/00* (2013.01); *G11C 16/00* (2013.01); *Y02B 60/1246* (2013.01); *Y02B 60/32* (2013.01)

(58) Field of Classification Search
USPC .............................. 710/5, 8–10; 713/320–323
See application file for complete search history.

(56) References Cited

U.S. PATENT DOCUMENTS

| | | | |
|---|---|---|---|
| 6,892,313 B1 * | 5/2005 | Codilian | G06F 1/3203 713/320 |
| 7,010,711 B2 | 3/2006 | Bashford et al. | |
| 7,475,265 B2 | 1/2009 | Oshikawa et al. | |
| 7,882,378 B2 | 2/2011 | Igari | |
| 7,908,502 B2 | 3/2011 | Park | |
| 8,010,742 B2 | 8/2011 | Molaro et al. | |
| 8,051,314 B2 | 11/2011 | Huffman et al. | |
| 8,325,555 B2 | 12/2012 | Jeong et al. | |

(Continued)

FOREIGN PATENT DOCUMENTS

| | | |
|---|---|---|
| JP | 2003-067691 A | 3/2003 |
| JP | 2011-013859 A | 1/2011 |
| JP | 2011-181011 A | 9/2011 |

OTHER PUBLICATIONS

Golding, Richard, et al. "Idleness is not Sloth". Winter'95 USENIX Technical Conference. New Orleans, LA. Jan. 16-19, 1995. pp. 201-212.*

(Continued)

*Primary Examiner* — Tammara Peyton
(74) *Attorney, Agent, or Firm* — Harness, Dickey & Pierce, P.L.C.

(57) ABSTRACT

A storage system includes a host and a storage device. The storage device includes a device controller and a device interface. The device controller is configured to generate interface idle time information in response to a command received from a host, the interface idle time information being determined based on an estimated time to execute at least one operation at the memory storage device. The device interface is configured to output the interface idle time information to the host.

20 Claims, 18 Drawing Sheets

(56) References Cited

U.S. PATENT DOCUMENTS

| | | | | |
|---|---|---|---|---|
| 2005/0114597 A1* | 5/2005 | Higashijima | ......... | G06F 3/0611 711/114 |
| 2005/0268132 A1* | 12/2005 | Yun | ...................... | G06F 1/3203 713/323 |
| 2006/0294403 A1* | 12/2006 | Bennett | ................ | G06F 1/3203 713/300 |
| 2007/0245163 A1* | 10/2007 | Lu | ........................ | G06F 1/3203 713/300 |
| 2009/0172441 A1* | 7/2009 | Kant | ..................... | G06F 1/3228 713/323 |
| 2010/0125849 A1* | 5/2010 | Oswald | ................ | G06F 9/4881 718/103 |
| 2011/0019225 A1* | 1/2011 | Jung | ..................... | B41J 29/393 358/1.15 |
| 2012/0140286 A1 | 6/2012 | Ueda | | |
| 2013/0091369 A1* | 4/2013 | Shih | ........................ | G06F 1/325 713/323 |
| 2015/0006931 A1* | 1/2015 | Cooper | ................. | G06F 1/3268 713/323 |

OTHER PUBLICATIONS

Hwang, Chi-Hong et al. "A Predictive System Shutdown Method for Energy Saving of Event-Driven Computation". ACM Transactions on Design Automation of Electronic Systems. vol. 5, No. 2. Apr. 2000. pp. 236-241.*

* cited by examiner

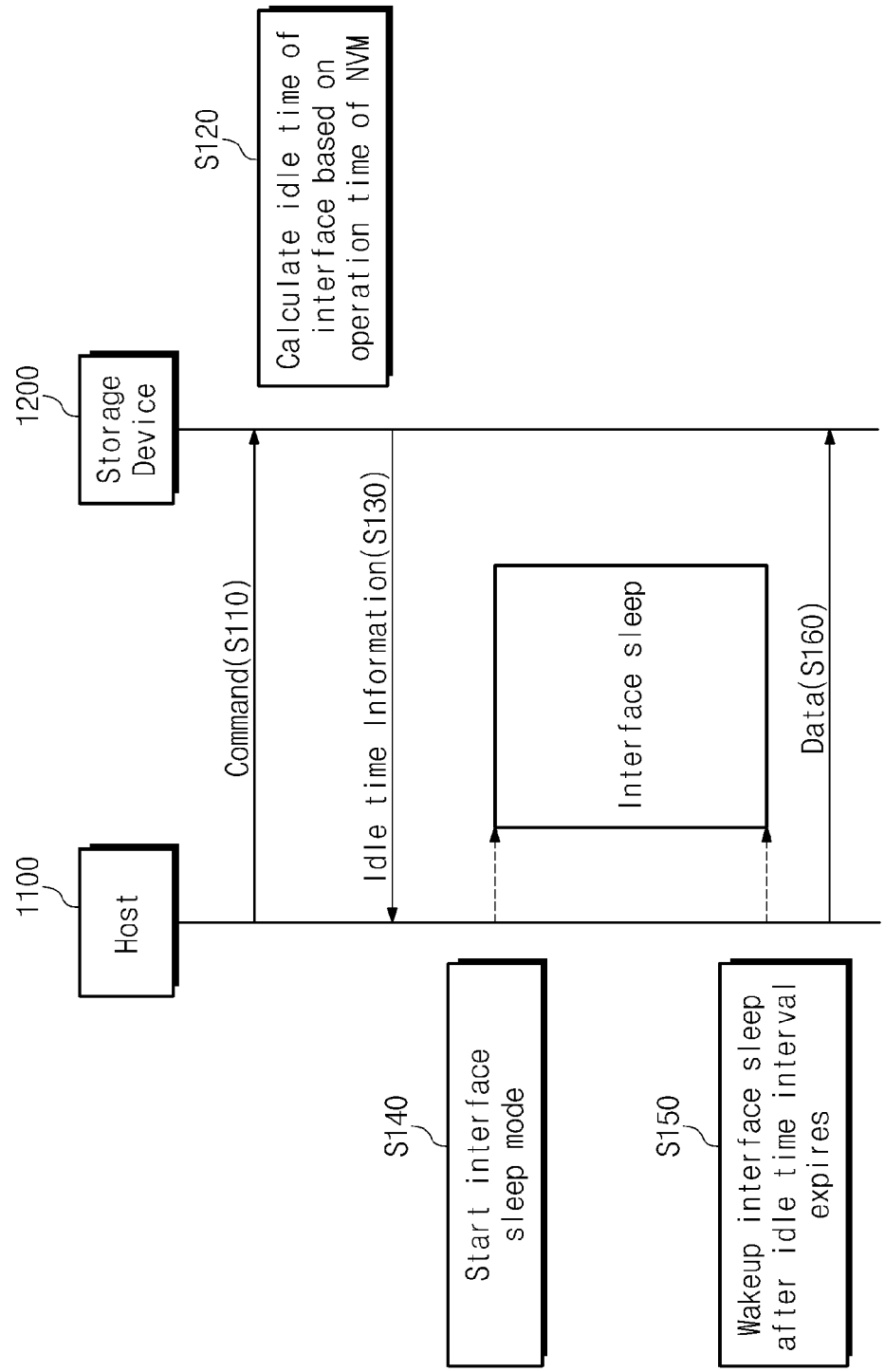

STORAGE SYSTEMS AND UFS SYSTEMS CONFIGURED TO CHANGE INTERFACE IDLE MODE TO ACTIVE STATE BASED ON ESTIMATED TIME TO EXECUTE AT LEAST ONE OPERATION

CROSS-REFERENCE TO RELATED APPLICATIONS

This application claims priority under 35 U.S.C. §119 to Korean Patent Application No. 10-2013-0079847 filed Jul. 8, 2013, in the Korean Intellectual Property Office, the entire contents of which are hereby incorporated by reference.

BACKGROUND

1. Field

Example embodiments of inventive concepts relate to storage systems, such as flash memory based storage systems and/or universal flash storage (UFS) systems.

2. Description of Conventional Art

A conventional storage system includes a host and a storage device. The host and the storage device may be connected through various interface standards. Power consumption of the storage system may be reduced using various methods.

One method for reducing power consumption is referred to as a HIPM (Host Initiate Power Management) method. In this example, if a host does not issue a command for a given time period (e.g., if the host is idle for given time period), then the storage device sets the storage device interface to a low-power state or a sleep state to reduce power consumption. The HIPM method, however, does not reduce power consumption in an active state when a command is being executed at the host.

Another method is referred to as a DIPM (Device Initiate Power Management) method. In this method, if the storage device interface of the storage device is idle for a given time period, then the storage device switches the state of the storage device interface to a low-power state or a sleep state. However, since firmware of the storage device and a command state of the host are not considered, the interface may enter a false sleep state. When in the false sleep state, the host or storage device waits due to entering into false sleep (e.g., until woken up) even though there is a command or data to be sent. This may result in consumption of unnecessary time and/or power due to the sleep and subsequent wakeup of the interface.

An idle time reference value may be increased to reduce the occurrence of the false sleep state. However, this results in an increase in an idle time when the interface is awake. Thus, power may still be unnecessarily consumed.

From a wakeup point of view, the above-described methods may start to wake up the interface when data or commands to be transferred through the interface exist. Although data or commands are ready to be sent, time and/or power may be consumed by a wakeup operation itself.

SUMMARY

At least one example embodiment provides a memory storage device including: a device controller configured to generate interface idle time information in response to a command received from a host, the interface idle time information being determined based on an estimated time to execute at least one operation at the memory storage device; and a device interface configured to output the interface idle time information to the host.

At least one other example embodiment provides a method of operating a memory storage device. According to at least this example embodiment, the method includes: generating interface idle time information in response to a command received from a host, the interface idle time information being determined based on an estimated time to execute at least one operation at the memory storage device; and outputting the interface idle time information to the host.

At least one other example embodiment provides a memory storage system including: a host and a storage device. The host includes a host interface configured to: switch from an active mode to a sleep mode in response to receiving interface idle time information from a storage device interface, the interface idle time information being indicative of a duration of a first interface idle time interval; and switch from the sleep mode to the active mode after expiration of the first interface idle time interval. The storage device includes: a device controller configured to generate the interface idle time information in response to a command received from the host, the interface idle time information being generated based on an estimated time to execute at least one operation at the storage device; and a storage device interface configured to output the interface idle time information to the host.

At least one other example embodiment provides a universal flash storage (UFS) device including: a plurality of flash memories; a device controller configured to generate interface idle time information in response to a command received from a UFS host, the interface idle time information being determined based on an estimated time to execute at least one operation at the UFS device, and the device controller being further configured to control the plurality of flash memories to execute the at least one operation; and a device interface configured to output the interface idle time information to the UFS host.

At least one other example embodiment provides a host of a memory storage system. According to at least this example embodiment, the host includes a host interface configured to: switch from an active mode to a sleep mode in response to interface idle time information from a storage device, the interface idle time information being indicative of a duration of an interface idle time interval; and switch from the sleep mode to the active mode after expiration of the interface idle time interval.

BRIEF DESCRIPTION OF THE DRAWINGS

Example embodiments will become apparent from the following description with reference to the following drawings, wherein like reference numerals refer to like parts throughout the various figures unless otherwise specified, and wherein:

FIGS. 2A and 2B are flow charts schematically illustrating example embodiments of methods of reducing power consumption of a storage system;

DETAILED DESCRIPTION

Figure 1:
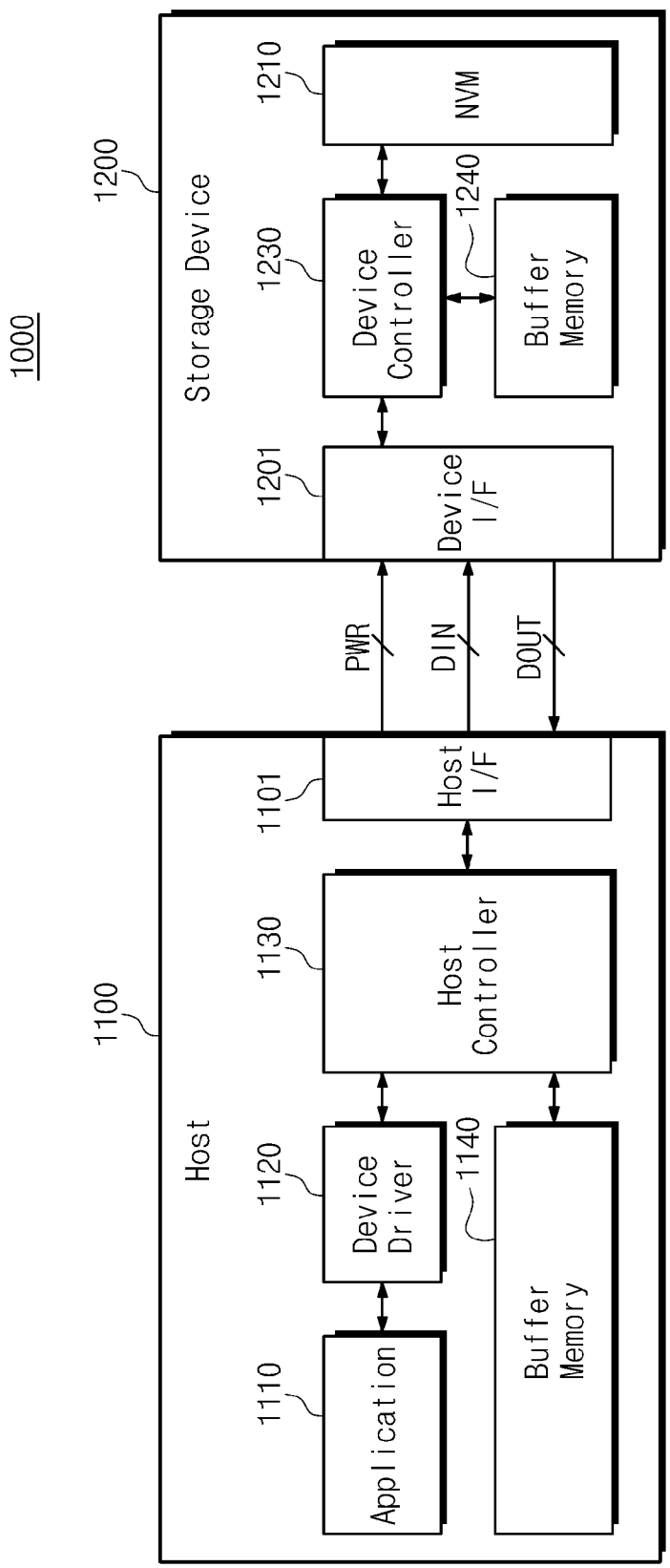
FIG. 1 is a block diagram schematically illustrating a storage system according to an example embodiment of inventive concepts.

Example embodiments will be described in detail with reference to the accompanying drawings. Inventive concepts, however, may be embodied in various different forms, and should not be construed as being limited only to the illustrated embodiments. Rather, the illustrated embodiments are provided as examples so that this disclosure will be thorough and complete, and will fully convey inventive concepts to those skilled in the art. Accordingly, known processes, elements, and techniques are not described with respect to some of the embodiments of inventive concepts. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Example embodiments are directed to memory storage devices, memory storage systems, host devices, and methods of operating the same. In at least one example embodiment, the memory storage device may be a universal flash storage (UFS) device, the host device may be a UFS host, and the memory storage system may be a UFS memory storage system.

According to at least one example embodiment, a memory storage device includes: a device controller and a device interface. The device controller is configured to generate interface idle time information in response to a command received from a host, the interface idle time information being determined based on an estimated time to execute at least one operation at the memory storage device. The device interface is configured to output the interface idle time information to the host.

At least one other example embodiment provides a memory storage system including: a host and a storage device. The host includes a host interface configured to: switch from an active mode to a sleep mode in response to receiving interface idle time information from a storage device interface, the interface idle time information being indicative of a duration of a first interface idle time interval; and switch from the sleep mode to the active mode after expiration of the first interface idle time interval. The storage device includes: a device controller configured to generate the interface idle time information in response to a command received from the host, the interface idle time information being generated based on an estimated time to execute at least one operation at the storage device; and a storage device interface configured to output the interface idle time information to the host.

Still another example embodiment provides a universal flash storage (UFS) device including: a plurality of flash memories; a device controller; and a device interface. The device controller is configured to generate interface idle time information in response to a command received from a UFS host, the interface idle time information being determined based on an estimated time to execute at least one operation at the UFS device. The device controller is further configured to control the plurality of flash memories to execute the at least one operation. The device interface is configured to output the interface idle time information to the UFS host.

At least one other example embodiment provides a host of a memory storage system. The host includes a host interface. The host interface is configured to: switch from an active mode to a sleep mode in response to interface idle time information from a storage device, the interface idle time information being indicative of a duration of an interface idle time interval; and switch from the sleep mode to the active mode after expiration of the interface idle time interval.

FIG. 1 is a block diagram schematically illustrating a storage system according to an example embodiment of inventive concepts.

Referring to FIG. 1, a storage system 1000 includes a host 1100 and a storage device 1200.

The host 1100 includes a host interface 1101, and the storage device includes a device interface 1201. The storage device 1200 and the host 1100 are connected to one another through the interfaces 1101 and 1201. The host interface 1101 and the storage interface 1201 may be standardized interfaces such as a UFS (Universal Flash Storage) interface, a SATA (serial advanced technology attachment (ATA)) interface, a SCSI (Small Computer Small Interface), a SAS (serial attached SCSI), etc. The host interface 1101 and the device interface 1201 are connected by data lines DIN and DOUT for exchanging data and/or signals, and by power lines PWR for providing power. In the example shown in FIG. 1, the host interface 1101 provides power to the device interface 1201 via the power line PWR.

Still referring to FIG. 1, the host 1100 further includes: an application 1110; a device driver 1120; a host controller 1130; and a buffer memory 1140.

According to at least some example embodiments, the application 1110 may refer to one or more application programs executed on the host 1100. The application 1110 and/or the device driver 1120 may be implemented by hardware, software and/or firmware. The host controller 1130 receives data from and sends data to the storage device 1200 through the host interface 1101.

According to at least some example embodiments, the buffer memory 1140 may be used as a main memory and/or a cache memory of the host 1100. The buffer memory 1140 may also be used as a driving memory to drive software such as the application 1110 and/or the device driver 1120.

As mentioned above, the storage device 1200 includes the device interface 1201. The storage device 1200 further includes: a nonvolatile memory 1210; a device controller 1230; and a buffer memory 1240. In this example, the storage device 1200 may be a data storage device based on a nonvolatile memory such as a flash memory or the like. For example, the nonvolatile memory 1210 may be a flash memory, a magnetic RAM (MRAM), a phase change RAM (PRAM), a ferroelectric RAM (FeRAM), etc.

The device controller 1230 controls an overall operation of the nonvolatile memory 1210 including, for example, write operations, read operations, erase operations, etc. The device controller 1230 exchanges data with the nonvolatile memory 1210 and/or the buffer memory 1240 through an address and/or data bus.

The buffer memory 1240 temporarily stores data to be stored in the nonvolatile memory 1210 and/or data read from the nonvolatile memory 1210. The buffer memory 1240 may be implemented by a volatile and/or nonvolatile memory.

The storage system 1000 in FIG. 1 may consume a relatively large amount of power at the interfaces connecting the host 1100 with the storage device 1200. When the host 1100 issues a command or data is transferred, the host interface 1101 and the device interface 1201 are in an active state. However, when data is not actually transferred, an interface enters an idle state. Because the host interface 1101 and the device interface 1201 wake up during an idle time of the active state, the interfaces may consume a relatively large amount of power.

The storage system 1000 according to at least one example embodiment of inventive concepts may reduce power consumption by calculating a duration of an interface idle time interval based on an estimated time to execute at least one operation (e.g., program, erase, read, copyback, etc.) at the storage device 1200, and then switching the mode of at least one of the host interface 1101 and the device interface 1201 from an active mode to a low-power mode during the calculated interface idle time interval.

Figure 2B:
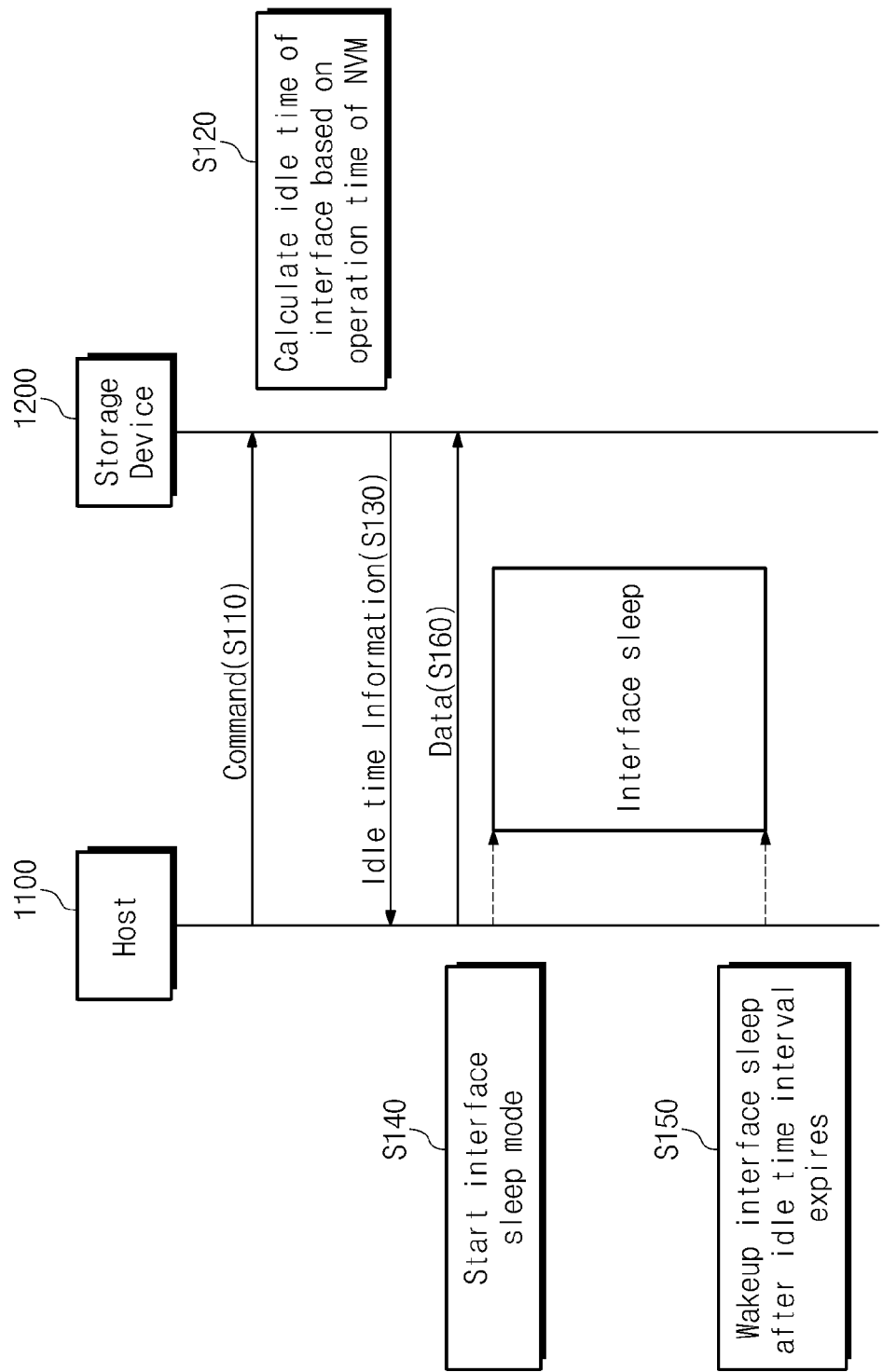

FIGS. 2A and 2B are flow charts schematically illustrating example embodiments of methods for reducing power consumption of a storage system. The methods shown in FIGS. 2A and 2B will be described with regard to the storage system shown in FIG. 1. However, it should be understood that the methods shown in FIGS. 2A and 2B may also be applied and/or implemented in accordance with other storage systems.

Referring to FIG. 2B, in operation S110 the host 1100 issues a command to a storage device 1200. The command may be, for example, a read command, write command, erase command, etc.

In operation S120, the storage device 1200 receives the command (e.g., a write command), and calculates a duration of an interface idle time interval for one or more of the host interface 1101 and the device interface 1201 based on the estimated operation time of the nonvolatile memory 1210.

In operation S130, the storage device 1200 outputs interface idle time information including the calculated duration of the interface idle time interval to the host 1100.

In operation S160, in response to receiving the interface idle time information the host 1100 sends data to the storage device 1200.

In operation S140, in response to receiving the interface idle time information and after sending the data to the storage device 1200, the host 1100 switches the host interface 1101 from the active mode to a low power mode. In this example, the low power mode may be referred to as an interface sleep mode or a sleep mode. While the host interface 1101 is in the sleep mode, the host 1100 may still be active and may perform various operations. The host 1100 need not be inactive and/or idle during the interface idle time interval.

In operation S150, after expiration of the interface idle time interval, the host 1100 wakes up the interface(s) in the sleep mode. In this example, the host 1100 switches the host interface 1101 from the low power mode to the active mode.

In the example shown in FIG. 2B, operation S160 is performed between the operation S130 of sending the interface idle time information and the operation S140 of switching the interface from the active mode to the interface sleep mode, as is the case in connection with a write operation performed at the storage device 1200. However, according to at least some other example embodiments, the host 1100 may switch the host interface 1101 from the active mode to a low power mode in response to receiving the interface idle time information without sending data, such as in the case of a read operation performed at the storage device 1200. In this case, the host 1100 switches the mode of the host interface 1101 from the active mode to the interface sleep mode after receiving the interface idle time information, and then switches the host interface 1101 back to the active mode after expiration of the interface idle time interval to receive the read data from the storage device 1200.

According to still another example embodiment, the storage device 1200 (e.g., on its own or at the direction of the host 1100) may switch the device interface 1201 from the active mode to the interface sleep mode after sending the interface idle time information to the host 1100. In this example, the storage device 1200 remains active during the interface idle time interval so as to complete the operation requested by the host 1100. After expiration of the interface idle time interval, the storage device 1200 switches the device interface 1201 from the interface sleep mode to the active mode.

FIG. 2A is a flow chart illustrating another example embodiment of a method for reducing power consumption of a storage system.

The method shown in FIG. 2A is similar to the method shown in FIG. 2B, except that operation S160 is performed after expiration of the interface idle time interval, and after the host 1100 wakes up the interface(s) from the sleep mode at operation S150. That is, for example, in the example shown in FIG. 2A the host 1100 sends data to the storage device 1200 after expiration of the interface idle time interval and after the host 1100 switches at least the host interface 1101 back to the active mode.

According to still another example embodiment, the host 1100 may send an interface idle time information request command to the storage device 1200. In this example embodiment, the interface idle time information request command requests interface idle time information from the storage device 1200. Unlike other commands (e.g., program, read, erase, etc.) discussed herein, the interface idle time information request command may not be a command to perform an operation (e.g., program, read, write, etc.) at the storage device 1200, but rather a request for interface idle time information from the storage device 1200. In this case, the command may be independent of an operation to be performed.

The storage system 1000 illustrated in FIG. 1 may be applied to a flash memory based mobile device or other electronic devices. Below, components and operating methods of the storage system 1000 according to an example embodiment of inventive concepts will be more fully described with reference to a universal flash storage (UFS) system.

Figure 3:
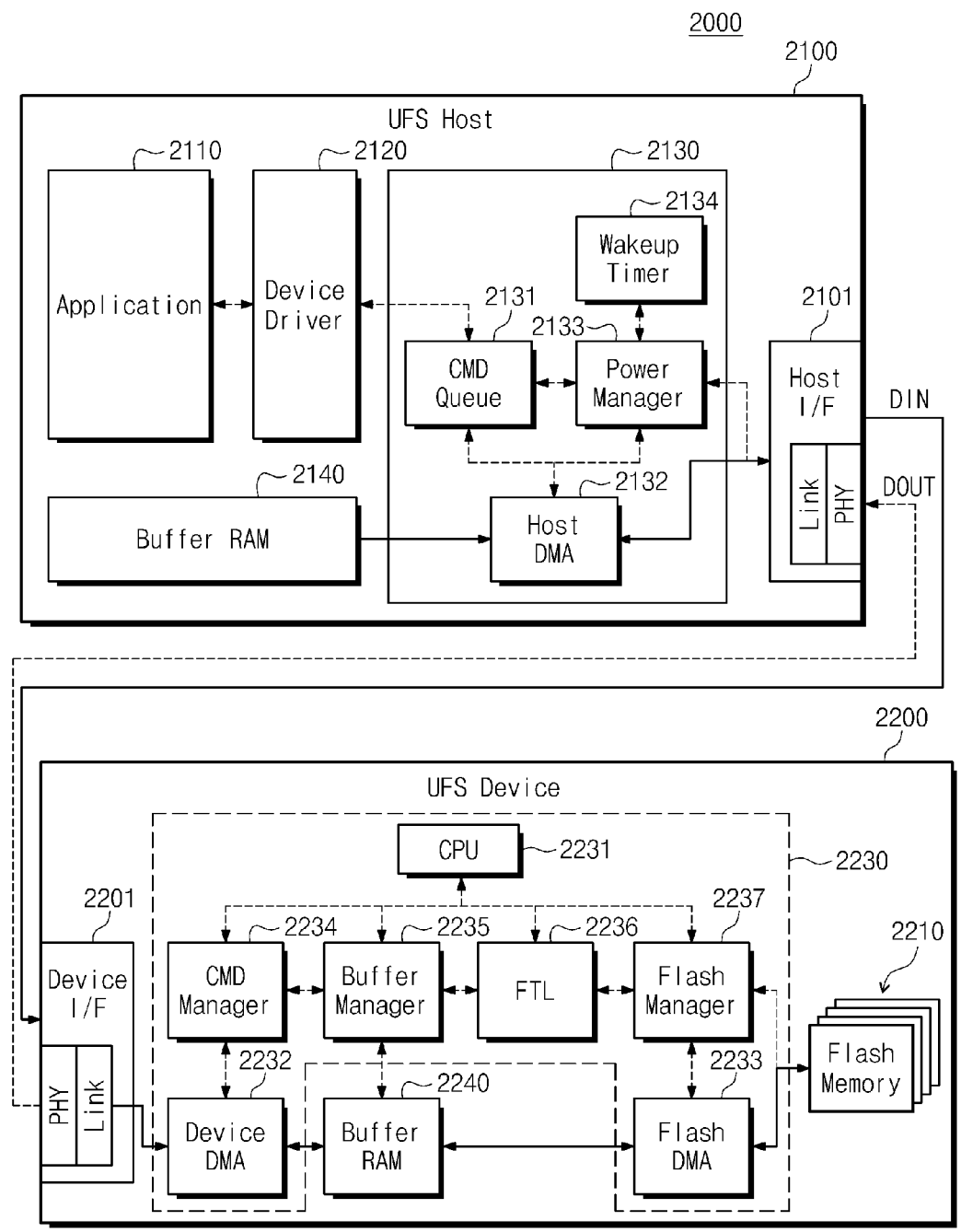
FIG. 3 is a block diagram schematically illustrating a universal flash storage (UFS) system according to an example embodiment of inventive concepts.

FIG. 3 is a block diagram schematically illustrating a UFS system according to an example embodiment of inventive concepts.

Referring to FIG. 3, a UFS system 2000 includes a UFS host 2100 and a UFS device 2200.

The UFS host 2100 includes: a host interface 2101; an application 2110; a device driver 2120; a host controller 2130; and a buffer RAM 2140. The host controller 2130 includes: a command queue 2131; a host DMA 2132; a power manager 2133; and a wakeup timer 2134.

In example operation, the application 2110 and the device driver 2120 generate a command (e.g., a program command), and output the generated command to the command queue 2131 of the host controller 2130. The command queue 2131 stores commands to be provided to the UFS device 2200 in order. The command queue 2131 outputs the stored commands to the host DMA 2132. The host DMA 2132 sends commands to the UFS device 2200 through a data line DIN via the host interface 2101.

The UFS device 2200 includes: a device interface 2201; a flash memory 2210; a device controller 2230; and a buffer RAM 2240. The device controller 2230 includes: a CPU 2231; a device DMA 2232; a flash DMA 2233; a command manager 2234; a buffer manager 2235; a flash translation layer (FTL) 2236; and a flash manager 2237.

In example operation, a command transferred from the UFS host 2100 to the UFS device 2200 is provided to the device DMA 2232 through the device interface 2201. The device DMA 2232 transfers the input command to the command manager 2234. The command manager 2234 receives data through the buffer manager 2235, and allocates the input data to the buffer RAM 2240.

In the example embodiment shown in FIG. 3, the command manager 2234 estimates a time taken and/or required to store corresponding data in the flash memory 2210 through the FTL, and calculates a duration of an interface idle time interval of an interface based on the estimated time. In another example, the command manager 2234 may calculate the duration of the interface idle time interval based on an estimated operation time for a program, read and/or erase operation of the flash memory 2210. The calculated duration of the interface idle time interval may be the same or substantially the same as an operation time of the flash memory 2210. Alternatively, the command manager 2234 may calculate the duration of the interface idle time interval by subtracting a time taken to receive next data for a continuous progression of an operation of the flash memory 2210 from the estimated operation time. In this case, the duration of the interface idle time interval is less than the estimated operation time.

In still another example embodiment, the CPU 2231 may estimate a time taken and/or required to store corresponding data in the flash memory 2210 through the FTL, and calculates a duration of an interface idle time interval of an interface based on the estimated time. In another example, the CPU 2231 may calculate the duration of the interface idle time interval based on an estimated operation time for a program, read and/or erase operation of the flash memory 2210. The calculated duration of the interface idle time interval may be the same or substantially the same as an operation time of the flash memory 2210. Alternatively, the CPU 2231 may calculate the duration of the interface idle time interval by subtracting a time taken to receive next data for a continuous progression of an operation of the flash memory 2210 from the estimated operation time. In this case, the duration of the interface idle time interval is less than the estimated operation time.

Still referring to FIG. 3, the UFS device 2200 provides the interface idle time information to the UFS host 2100. In one example, the UFS device 2200 may transfer the interface idle time information to the UFS host 2100 using RTT (READY_TO_TRANSFER) UPIU for a write operation and DATA IN UPIU for a read operation. In this case, the interface idle time information to be transferred may be recorded in a reserved field.

The UFS host 2100 receives the interface idle time information from the UFS device 2200, and provides the interface idle time information to the power manager 2133. The power manager 2133 checks the command queue 2131 to determine whether an additional command exists. If an additional command does not exist, then the power manager 2133 switches the host interface 2101 to a low power mode. In this example embodiment, the power manager 2133 may also control the device interface 2201 to switch the device interface 2201 to a low power mode during the interface idle time interval. As discussed above, the low power mode may be referred to as a sleep mode or an interface sleep mode. At the same or substantially the same time (e.g., simultaneously and/or concurrently) with switching to the low power mode, the power manager 2133 resets the wakeup timer 2134 and sets the duration of the interface idle time interval to the duration included with the interface idle time information received from the UFS device 2200.

As the interface idle time interval gradually decreases and expires (e.g., becomes "0"), the wakeup timer 2134 provides an interface idle time end signal to the power manager 2133. In response to the interface idle time end signal, the power manager 2133 switches the host interface 2101 from the low power mode to the active mode. Additionally, the power manager 2133 may also switch the device interface 2201 from the low power mode to the active mode.

When the host interface 2101 and the device interface 2201 are in the active mode, the UFS host 2100 sends data from the host interface 2101 to the device interface 2201 of the UFS device 2200. In this example, the UFS host 2100 receives the interface idle time information from the UFS device 2200, and provides data before a mode of one or more of the host interface 2101 and the device interface 2201 is switched from the active mode to the low power mode.

The UFS device 2200 stores the input data in the buffer RAM 2240 through the device DMA 2232 and the buffer manager 2235. The buffer RAM 2240 provides data to the flash manager 2237 through the flash DMA 2233. The flash manager 2237 stores data at a selected address in the flash memory 2210 based on address mapping information.

Once data transfer needed for a command and a program are completed, the UFS device 2200 sends a response signal from the device interface 2201 to the host interface 2101 of the UFS host 2100 to inform the UFS host 2100 that the command is completed. In response to receiving the response signal from the UFS device 2200, the UFS host 2100 informs the device driver 2120 and the application 2110 that the command is completed. Once the command is complete, the UFS host 2100 terminates the operation corresponding to the command.

Referring to FIG. 3, the UFS device 2200 calculates a duration of an interface idle time interval, in which one or more of the host interface 2101 and the device interface 2201 are put into a low power mode of the active state, based on an estimated operation time for one or more operations to be performed at the flash memory 2210. The UFS device 2200 provides interface idle time information including the duration of the interface idle time interval to the UFS host 2100. The UFS host 2100 then switches a mode of the host interface 2101 from the active mode to the low power mode in response to receiving the interface idle time information. Once the interface idle time interval expires, the UFS host 2100 switches the mode of the host interface 2101 to the active mode. In at least one example embodiment, the UFS device 2200 may switch the mode of the device interface 2201 according to the calculated interface idle time interval.

The UFS system 2000 according to at least some example embodiments of inventive concepts may reduce power consumption by setting one or more of the host and the device interfaces to the low power mode during an interface idle time interval. Also, a success rate of mode switching of the one or more interfaces may be improved by calculating the duration of the interface idle time interval based on an estimated operation time for performing one or more operations at the flash memory.

Below, example operation of the UFS system 2000 according to various operations of the flash memory 2210 illustrated in FIG. 3 will be more fully described.

Interface Mode Switching at Program Operation of Flash Memory

Figure 4:
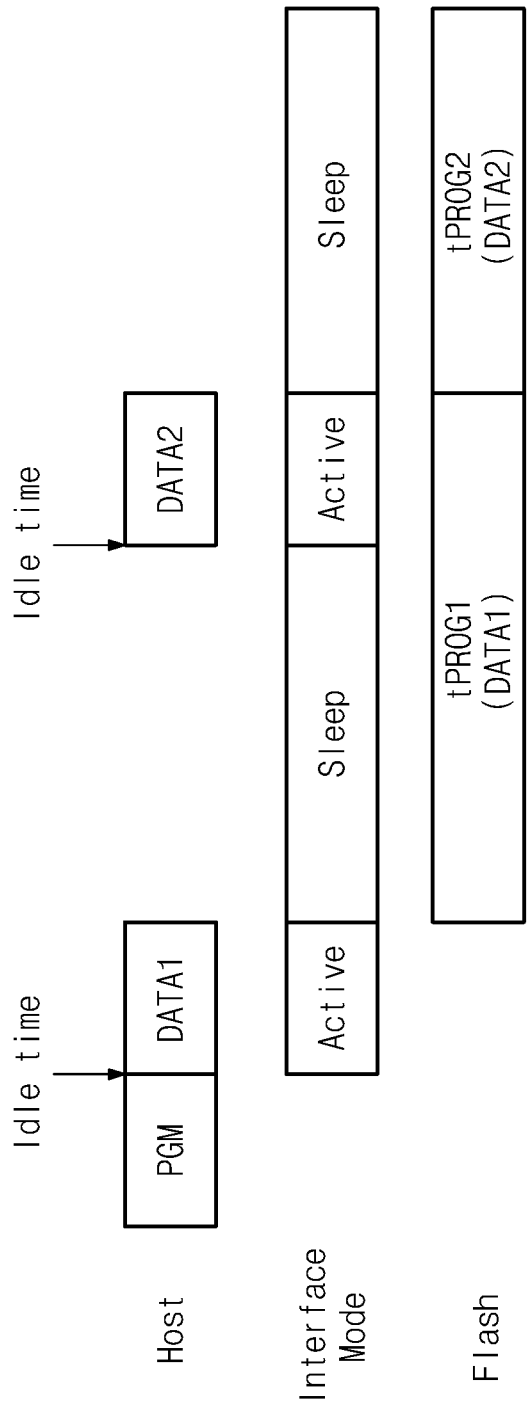
FIGS. 4 and 5 are example timing diagrams schematically illustrating examples in which an interface mode is switched at a program operation of a flash memory.
Figure 5:
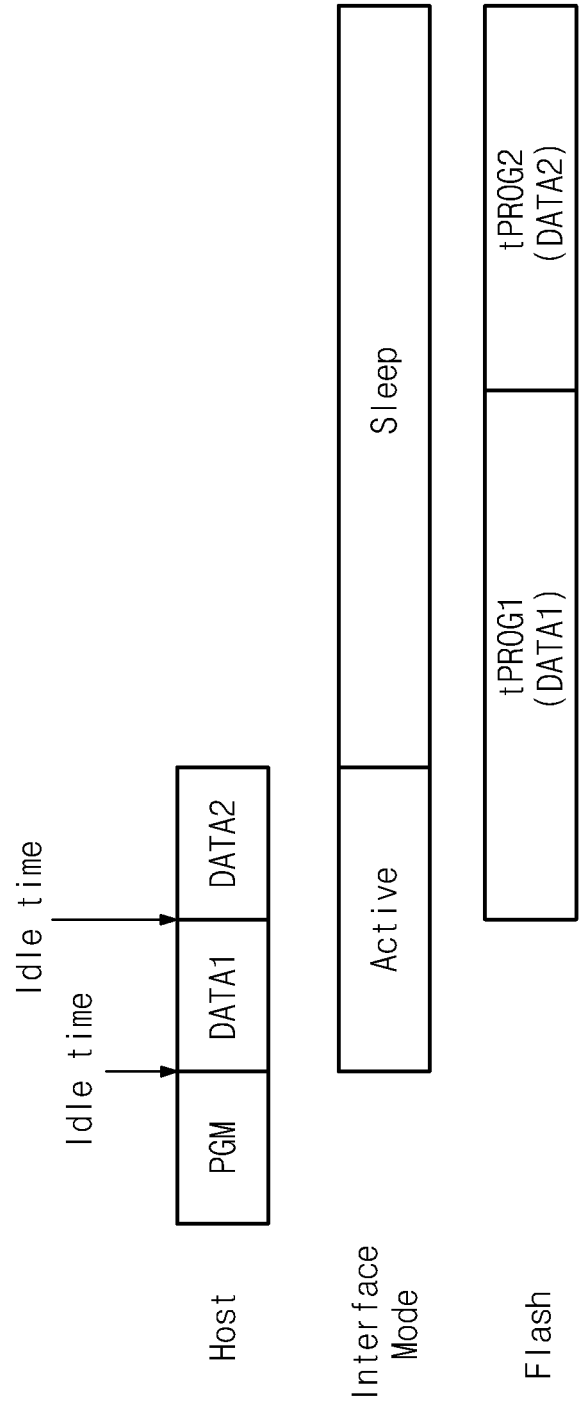

FIGS. 4 and 5 are example timing diagrams schematically illustrating examples in which a mode of the host interface is switched when the flash memory 2210 executes a program operation.

Referring to FIG. 4, the UFS host 2100 provides a program command PGM to the UFS device 2200. In response to the program command PGM, the UFS device 2200 calculates a duration of a first interface idle time interval based on a first program time tPROG1 for programming first data DATA1 to the flash memory 2210. In this example, the first program time tPROG1 may be an estimated time to perform a first program operation corresponding to the program command CMD from the UFS host 2100. However, the first program time tPROG1 may be estimated or a given (or alternatively desired or predetermined) time period.

The UFS host 2100 sends the first data DATA1 to the UFS device 2200, and the UFS device 2200 temporarily stores the first data DATA1 in the buffer RAM 2240. During the first program time tPROG1, the UFS device 2200 programs the first data DATA1 from the buffer RAM 2240 to the flash memory 2210. While the flash memory 2210 performs the first program operation, the UFS device 2200 may not receive data from the UFS host 2100 as a result of the operation and/or because of insufficient free space of the buffer RAM 2240.

According to at least this example embodiment, while the flash memory 2210 performs an operation corresponding to the program command PGM, data is not transferred back to the UFS host 2100. As illustrated in FIG. 4, the first program time tPROG1 may be longer than a time to transfer the first data DATA1 from the UFS host 2100 to the UFS device 2200. Accordingly, power may be unnecessarily consumed by one or more of the host interface 2101 and the device interface 2201 when the flash memory 2210 performs an operation.

To reduce power consumption, according to at least some example embodiments, the UFS device 2200 calculates a duration of the first interface idle time interval based on an estimated operation time to perform the first program operation at the flash memory 2210, and provides first interface idle time information including the duration of the first interface idle time interval to the UFS host 2100. The UFS host 2100 switches a mode of the host interface 2101 from the active mode to the low power (or sleep) mode based on the received first interface idle time information.

After the first interface idle time interval expires, the UFS host 2100 switches the host interface 2101 from the low power mode back to the active mode.

Still referring to FIGS. 3 and 4, in at least one example embodiment, the UFS device 2200 may provide the UFS host 2100 with interface idle time information associated with a program operation for the first data DATA1 using an RTT signal. The UFS host 2100 sends the first data DATA1 to the UFS device 2200, and switches the host interface 2101 from the active mode to the sleep mode. At this time, the UFS host 2100 also resets a wakeup timer 2134, and sets a duration of the first interface idle time interval. During the first program time tPROG1, the flash memory 2210 performs (e.g., internally performs) a first program operation on the first data DATA1.

When the first interface idle time interval expires, the UFS host 2100 switches the host interface 2101 from the sleep mode back to the active mode, and sends second data DATA2 to the UFS device 2200. In response to the second data, the UFS device 2200 provides second interface idle time information associated with a second program operation for the second data DATA2 to the UFS host 2100 using the RTT signal. The second interface idle time information includes a duration of a second interface idle time interval calculated based on a second program time tPROG2 to perform the second program operation.

In response to receiving the second interface idle time information, the UFS host 2100 switches the host interface 2101 from the active mode to the sleep mode. During the second program time tPROG2, the UFS device 2200 performs the second program operation on the second data DATA2.

FIG. 5 shows an example in which second data DATA2 is transferred after first data DATA1 is sent. In this example, the UFS device 2200 calculates the duration of an interface idle time interval based on program time for program operations for programming both the first data DATA1 and the second data DATA2.

Referring to FIG. 5, the UFS device 2200 provides a UFS host 2100 with interface idle time information using an RTT signal before the first data DATA1 or the second data DATA2 is transferred by the UFS host 2100. The interface idle time information includes the calculated duration of the interface idle time interval. After the second data DATA2 is transferred, the UFS host 2100 switches the host interface 2101 from an active mode to a sleep mode.

Upon receiving the first data DATA1 and the second data DATA2, the flash memory 2210 performs a first program operation on the first data DATA1 during a first program time tPROG1. The flash memory 2210 then performs a second program operation on the second data DATA2 during a second program time tPROG2 after completing the first program operation on the first data DATA1. In accordance with the example embodiment illustrated in FIG. 5, an interface mode switching frequency may be reduced.

Figure 6:
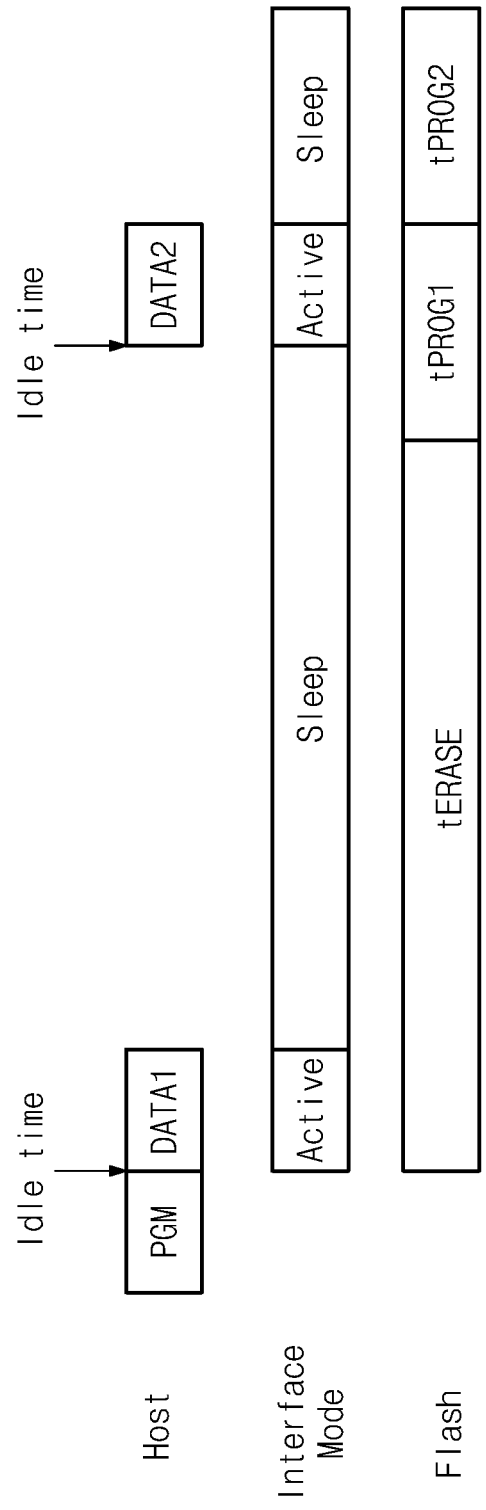
FIGS. 6 to 8 are example timing diagrams schematically illustrating examples in which an interface mode is switched in a case where a flash memory performs an erase operation before a program operation.
Figure 7:
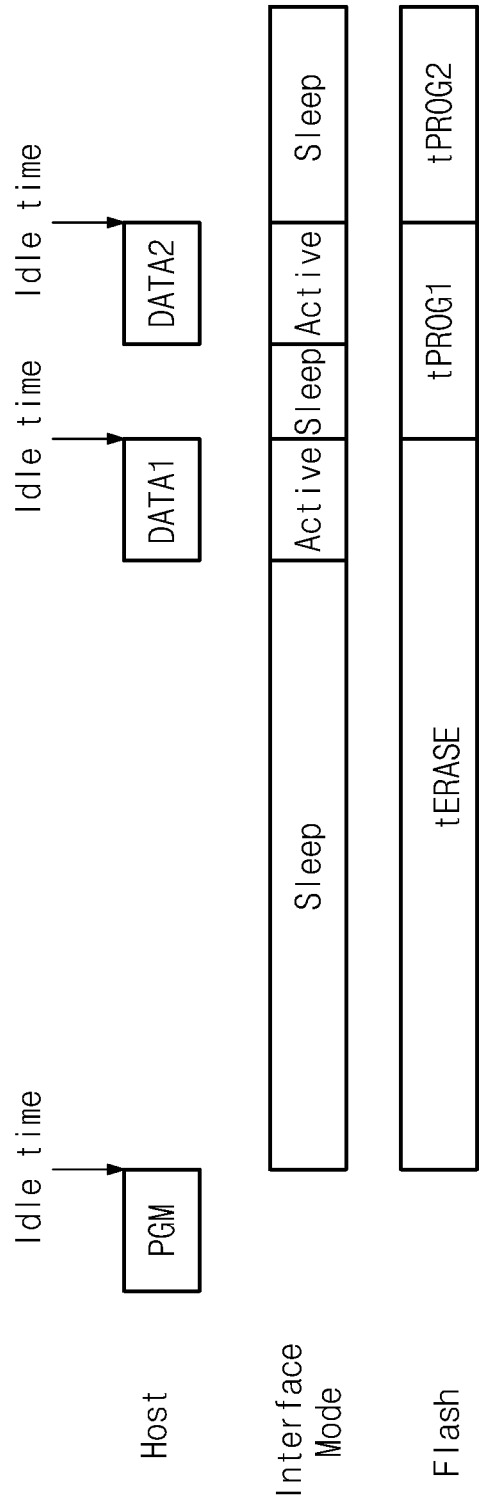
Figure 8:
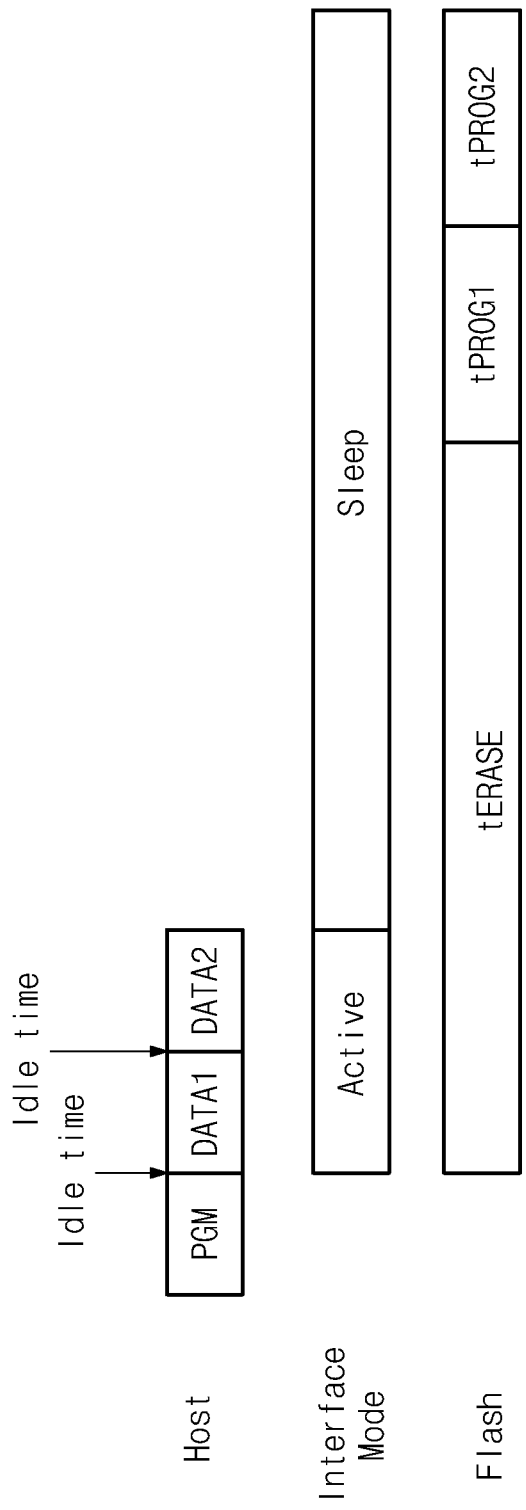

Interface Mode Switching in the Case that an Erase Operation is Performed Before Program Operation FIGS. 6 to 8 are example timing diagrams schematically illustrating an example in which the UFS host 2100 switches the mode of the host interface 2101 when a flash memory performs an erase operation before a program operation.

Because a flash memory such as flash memory 2210 does not support an overwrite operation, an erase operation may need to be performed before a program operation. In the event that an erase operation is performed before a program operation, the UFS device 2200 calculates a duration of the interface idle time interval based on both an erase time and a program time.

Referring to FIG. 6, the UFS host 2100 sends the program command PGM to the UFS device 2200. The UFS device 2200 receives the program command PGM, and calculates a duration of a first interface idle time interval based on an erase time tERASE for a memory block of the flash memory 2210 and a first program time tPROG1 to program the first data DATA1.

The UFS device 2200 provides the UFS host 2100 with first interface idle time information including the duration of the first interface idle time interval using an RTT signal.

In response to the first interface idle time information, the UFS host 2100 transfers the first data DATA1 to the UFS device 2200, and switches the host interface 2101 from the active mode to the sleep mode. The flash memory 2210 performs an erase operation during the erase time tERASE, and then performs a first program operation on the first data DATA1 during the first program time tPROG1.

When the first interface idle time interval expires, the UFS host 2100 switches the host interface 2101 from the sleep mode to the active mode. The UFS device 2200 then provides, to the UFS host 2100 using the RTT signal, second interface idle time information associated with a second program operation to program the second data DATA2. The second interface idle time information includes a duration of a second interface idle time interval calculated based on a second program time tPROG2 for the second program operation. The UFS host 2100 sends the second data DATA2 in response to receiving the second interface idle time information, and then switches the host interface 2101 from the active mode to the sleep mode. During the second program time tPROG2, the UFS device 2200 performs the second program operation on the second data DATA2.

Referring to FIG. 7, the UFS device 2200 receives the program command PGM, and calculates a duration of a first interface idle time interval based on the erase time tERASE for performing an erase operation on the memory block of the flash memory 2210. The UFS device 2200 provides first interface idle time information including the duration of the first interface idle time interval to the UFS host 2100.

In response to receiving the first interface idle time information, the UFS host 2100 switches the host interface 2101 to the sleep mode. The flash memory 2210 performs an erase operation during the erase operation tERASE.

After the duration of the first interface idle time interval expires, the UFS host 2100 switches the host interface 2101 back to the active mode, and sends the first data DATA1 to the UFS device 2200. The UFS device 2200 then provides the UFS host 2100 with second interface idle time information associated with a first program operation to program the first data DATA1. In this case, the second idle time information includes a duration of a second interface idle time interval calculated based on a first program time tPROG1 for programming the first data DATA1. The UFS host 2100 switches the host interface 2101 to the sleep mode in response to receiving the second interface idle time information. The flash memory 2210 performs the first program operation during the first program time tPROG1.

After the second interface idle time interval expires, the UFS host 2100 switches the host interface 2101 to the active mode, and sends the second data DATA2 to the UFS device 2200. The UFS device 2200 provides the UFS host 2100 with third interface idle time information associated with a second program operation for programming the second data DATA2. The third idle time information includes a duration of a third interface idle time interval calculated based on a second program time tPROG2 for a second program operation for programming the second data DATA2. The UFS host 2100 switches the host interface 2101 to the sleep mode based on the third interface idle time information. The flash memory 2210 performs the second program operation during the second program time tPROG2.

Referring to FIG. 8, in response to receiving the program command PGM, the UFS device 2200 calculates a duration of an interface idle time interval based on the erase time tERASE, the first program time tPROG1, and the second program time tPROG2. The UFS device 2200 provides interface idle time information including the duration of the interface idle time interval to the UFS host 2100. In this example, the UFS device 2200 provides the interface idle time information to the UFS host 2100 in response to receiving the program command PGM and before the first data DATA1 and the second data DATA2 are transferred.

After transferring the first data DATA1 and the second data DATA2, the UFS host 2100 switches the host interface 2101 from the active mode to the sleep mode. The flash memory 2210 performs an erase operation during the erase time tERASE, a first program operation on the first data DATA1 during the first program time tPROG1, and a second program operation on the second data DATA2 during the second program time tPROG2. In accordance with the method illustrated in FIG. 8, an interface mode switching frequency may be reduced.

Interface Mode Switching in a Case where Garbage Collection is Performed

FIGS. 9 to 12 are example timing diagrams illustrating example embodiments of methods for switching an interface mode when garbage collection accompanies a program operation.

Garbage collection may be performed to secure free blocks in a flash memory and/or for wear-leveling. Garbage collection may be performed by erasing a memory block to be newly allocated, and copying data of an older memory block to a new memory block. Garbage collection may further include an operation of erasing the old memory block.

According to at least some example embodiments, garbage collection may be executed in connection with a program operation in response to a corresponding program command. For example, if a host provides a program command to a storage device, the storage device may perform a garbage collection operation in parallel (e.g., concurrently and/or simultaneously) with the program operation. A duration of the interface idle time interval may be calculated based on a series of operation times for garbage collection (e.g., an erase time of a memory block, a data read time of an old memory block, a program time of a new memory block, etc.).

Example embodiments shown in FIGS. 9 through 12 will be described in more detail below.

Figure 9:
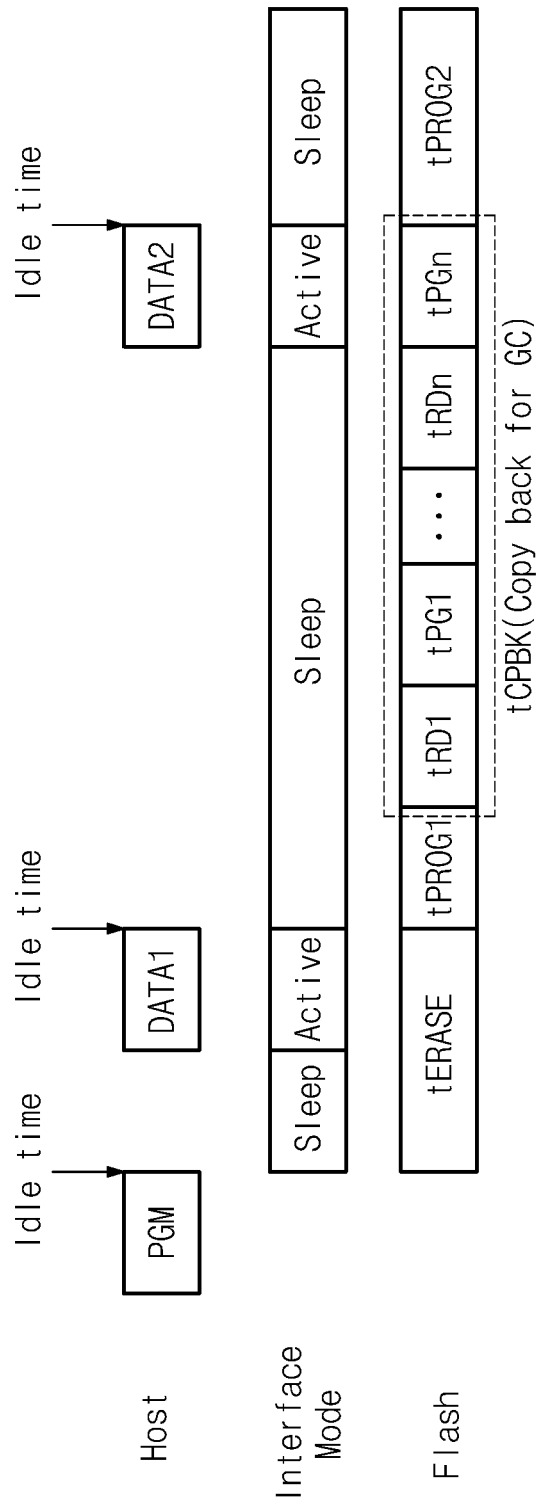
FIGS. 9 to 12 are example timing diagrams illustrating an example embodiment of a method of switching an interface mode when garbage collection accompanies a program operation.

Referring to FIG. 9, in response to receiving a program command PGM, the UFS device 2200 estimates and/or calculates an erase time tERASE for a memory block of the flash memory 2210, a first program time tPROG1 for programming first data DATA1, a copyback time tCPBK for garbage collection, and a second program time tPROG2 for programming second data DATA2.

As illustrated in FIG. 9, the UFS device 2200 calculates a duration of a first interface idle time interval based on the erase time tERASE, a duration of a second interface idle time interval based on the first program time tPROG1 and the copyback time tCPBK, and a duration of a third interface idle time interval based on the second program time tPROG2. In this example, the copyback time tCPBK for garbage collection may include a first read time tRD1 for reading an old memory block, a first program time tPG1 for programming a new memory block, $2^{nd}$ to $n^{th}$ read times tRD2 to tRDn and $2^{nd}$ to $n^{th}$ program times tPG2 to tPGn for reading and programming respective old and new memory blocks.

Still referring to FIG. 9, the UFS device 2200 provides the UFS host 2100 with first interface idle time information associated with an erase operation of the flash memory 2210, and performs the erase operation during the erase time tERASE. The first interface idle time information includes the duration of the first interface idle time interval. The UFS host 2100 switches the host interface 2101 from the active mode to a sleep mode during the first interface idle time interval based on the first interface idle time information.

After the first interface idle time interval expires, the UFS host 2100 switches the host interface 2101 from the sleep mode to the active mode, and sends the first data DATA1 to the UFS device 2200. In response to the first data DATA1, the UFS device 2200 provides the UFS host 2100 with second interface idle time information associated with a first program operation for the first data DATA1 and a copyback operation for the garbage collection. The second interface idle time information includes the duration of the second interface idle time interval. The UFS device 2200 performs the first program operation during the first program time tPROG1 and performs the copyback operation during the copyback time tCPBK. The UFS host 2100 switches the host interface 2101 from the active mode to the sleep mode during the second interface idle time interval based on the second interface idle time information.

After the second interface idle time interval expires, the UFS host 2100 switches the host interface 2101 from the sleep mode to the active mode, and sends the second data DATA2 to the UFS device 2200. In response to receiving the second data DATA2, the UFS device 2200 provides the UFS host 2100 with third interface idle time information associated with a second program operation for programming the second data DATA2. The third interface idle time information includes the duration of the third interface idle time interval. The UFS device 2200 then performs the second program operation during the second program time tPROG2. The UFS host 2100 switches the host interface 2101 from the active mode to the sleep mode based on the third interface idle time information.

Figure 10:
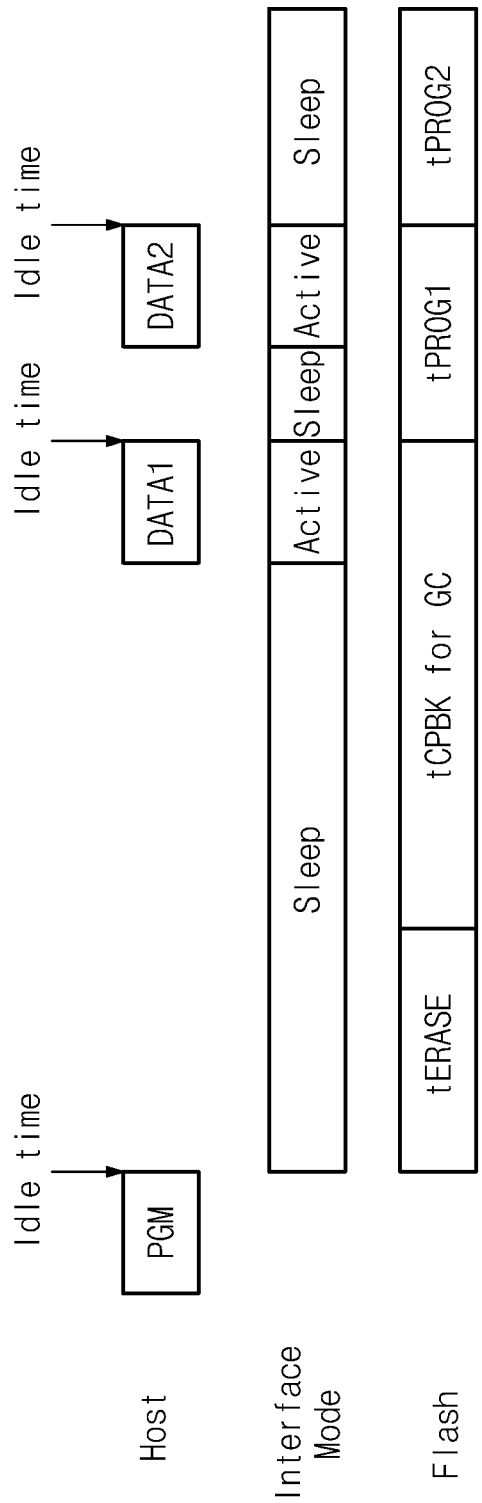

Referring to FIG. 10, in response to receiving the program command PGM, the UFS device 2200 calculates and/or estimates an erase time tERASE to erase a memory block of the flash memory 2210 and a copyback time tCPBK for garbage collection. The UFS device 2200 calculates a duration of a first interface idle time interval based on the erase time tERASE and the copyback time tCPBK. The UFS device 2200 provides the UFS host 2100 with first interface idle time information, performs the erase operation during the erase time tERASE, and performs the copyback operation during the copyback time tCPBK. The first idle time information includes the calculated duration of the first interface idle time interval. Based on the first interface idle time information, the UFS host 2100 switches the host interface 2101 from the active mode to the sleep mode.

After the first interface idle time interval expires, the UFS host 2100 switches the host interface 2101 from the sleep mode to the active mode, and sends the first data DATA1 to the UFS device 2200. In response, the UFS device 2200 provides the UFS host 2100 with second interface idle time information associated with a first program operation to program the first data DATA1. The second interface idle time information includes a duration of a second interface idle time interval calculated based on the first program time tPROG1 for programming the first data DATA1. In response to receiving the second interface idle time information, the UFS host 2100 switches the host interface 2101 from the active mode to the sleep mode. The UFS device 2200 performs the first program operation during the first program time tPROG1.

After expiration of the second interface idle time interval, the UFS host 2100 switches the host interface 2101 form the sleep mode to the active mode, and sends the second data DATA2 to the UFS device 2200. In response to the second data DATA2, the UFS device 220 provides third interface idle time information to the UFS host 2100. The third interface idle time information includes a duration of a third interface idle time interval calculated based on a second program time tPROG2 for programming the second data DATA2. Based on the third interface idle time information, the UFS host 2100 switches the host interface 2101 from the active mode to the sleep mode.

Figure 11:
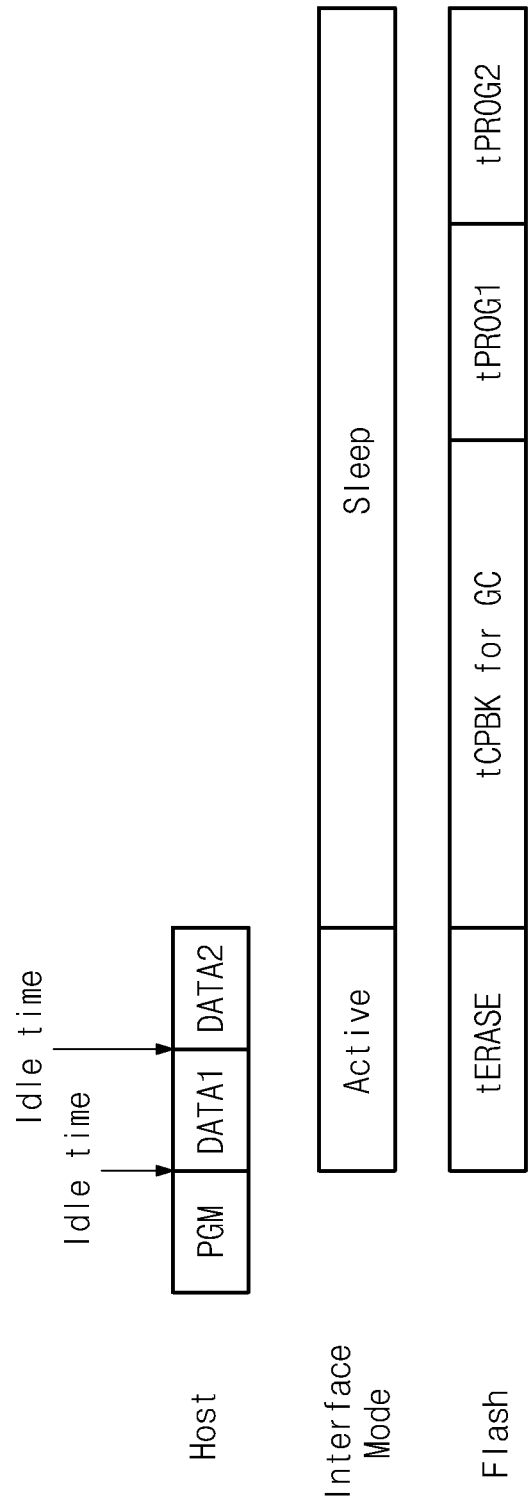

Referring to FIG. 11, in response to receiving the program command PGM, the UFS device 2200 calculates a duration of an interface idle time interval based on an erase time tERASE, a copyback time tCPBK for garbage collection, a first program time tPROG1 for programming the first data DATA1, and a second program time tPROG2 for programming the second data DATA2. The UFS device 2200 then provides interface idle time information including the duration of the interface idle time interval to the UFS host 2100. The UFS device 2200 may provide the UFS host 2100 with the interface idle time information before a first data transfer of the first data DATA1 and/or a second data transfer of the second data DATA2.

After transferring both the first data DATA1 and the second data DATA2, the UFS host 2100 switches the host interface 2101 from the active mode to the sleep mode. In this example, the UFS device 2200 performs the erase operation, the copyback operation, the first program operation, and the second program operation sequentially after receiving the second data DATA2. In accordance with at least the example embodiment illustrated in FIG. 11, an interface mode switching frequency may be reduced.

Figure 12:
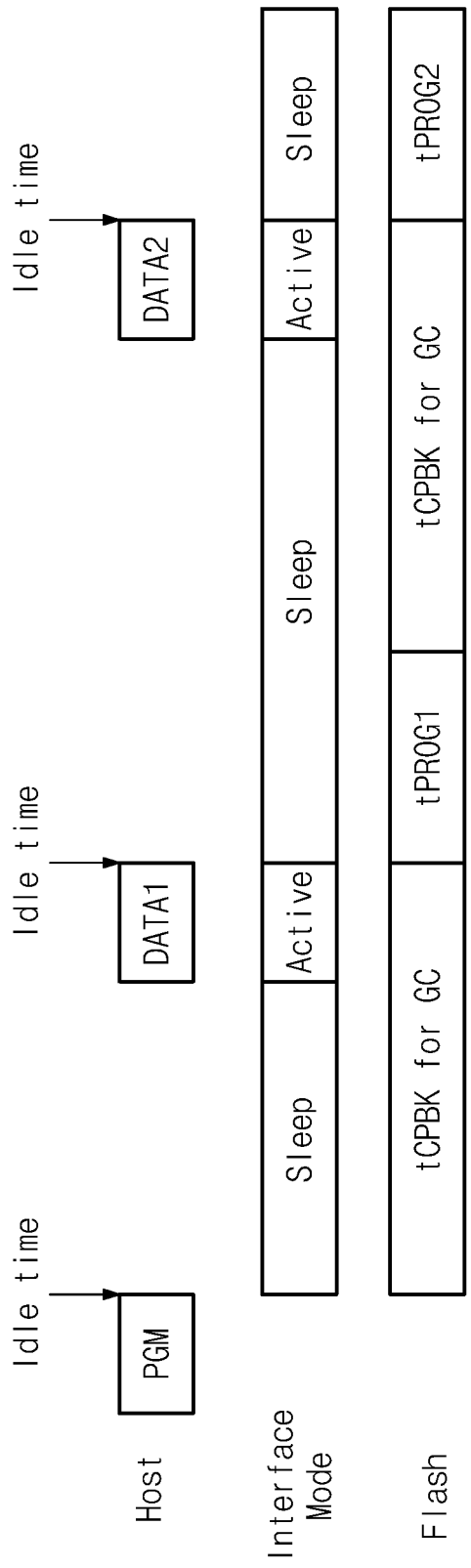

In the example embodiment shown in FIG. 12, in response to receiving the program command PGM, the flash memory 2210 sequentially performs a first copyback operation for garbage collection, a first program operation to program the first data DATA1, a second copyback operation for garbage collection, and a second program operation to program the second data DATA2.

In this example, the UFS device 2200 provides the UFS host 2100 with first interface idle time information associated with the first copyback operation in response to receiving the program command PGM, and performs the first copyback operation during copyback time tCPBK. The first interface idle time information includes a duration of a first interface idle time interval calculated based on the copyback time tCPBK for performing the first copyback operation. The UFS host 2100 switches the host interface 2101 from the active mode to the sleep mode during the first interface idle time interval based on the first interface idle time information.

Still referring to FIG. 12, after the first interface idle time interval expires, the UFS host 2100 switches the host interface 2101 back to the active mode, and provides the first data DATA1 to the UFS device 2200. In response, the UFS device 2200 provides the UFS host 2100 with second interface idle time information associated with the first program operation to program the first data DATA1 and to perform a second copyback operation. The second interface idle time information includes a duration of a second interface idle time interval calculated based on a first program time tPROG for the first program operation and a copyback time tCPBK to perform the second copyback operation. The UFS host 2100 switches the host interface 2101 from the active mode to the sleep mode during the second interface idle time interval.

After the second interface idle time interval expires, the UFS host 2100 switches the host interface 2101 back to the active mode and provides the second data DATA2 to the UFS device 2200. In response, the UFS device 2200 provides third interface idle time information to the UFS host 2100. The third interface idle time information includes a duration of a third interface idle time interval calculated based on second program time tPROG2 for programming the second data DATA2. The UFS host 2100 switches the host interface 2101 from the active mode to the sleep mode based on the third interface idle time information.

Interface Mode Switching in Case where Read Reclaim is Performed

Figure 13:
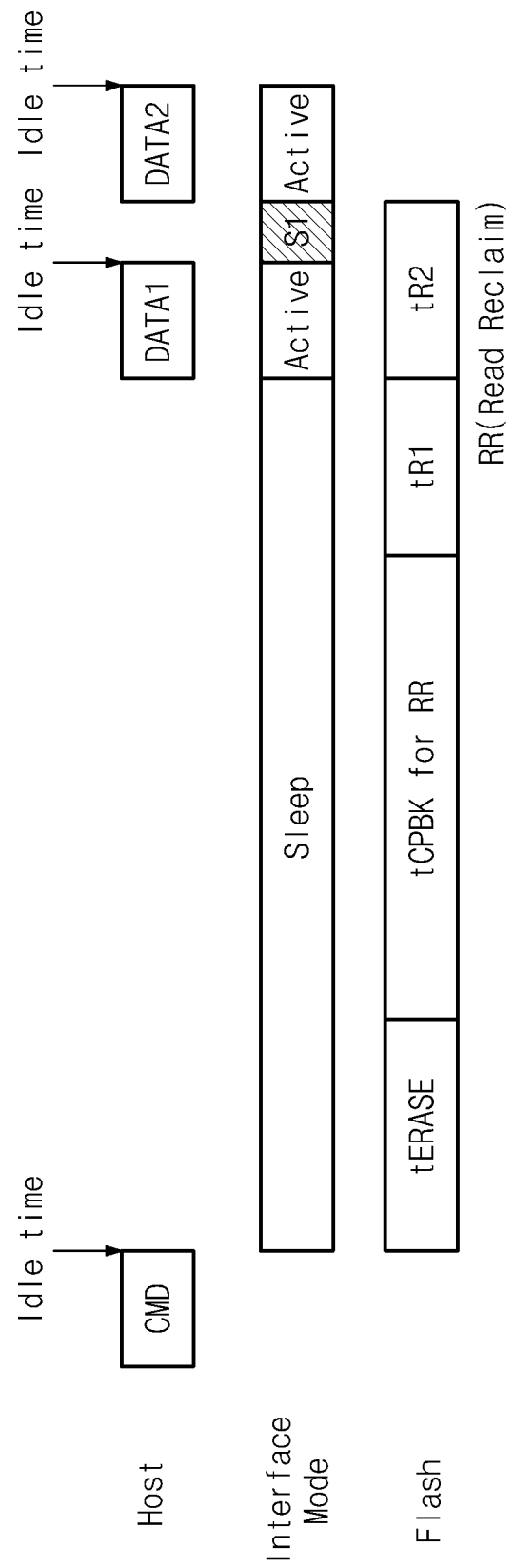
FIGS. 13 to 15 are example timing diagrams schematically illustrating a method of switching an interface mode when read reclaim operation is used.
Figure 14:
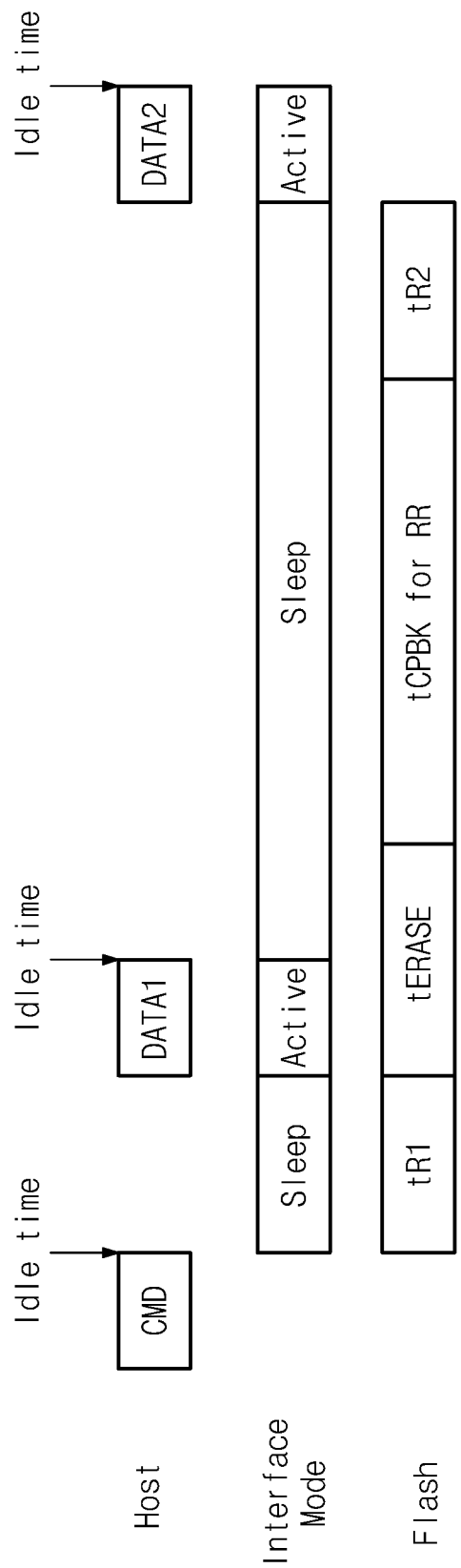
Figure 15:
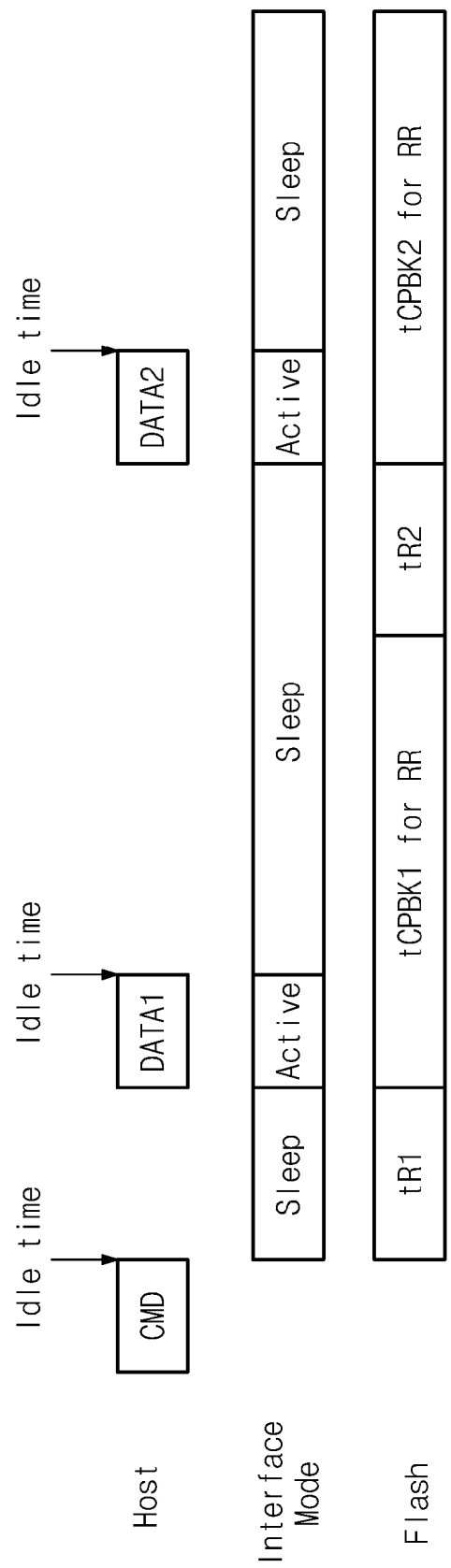

FIGS. 13 to 15 are example timing diagrams schematically illustrating a method for switching an interface mode when read reclaim is performed.

As the same area of a flash memory is repetitively read, the probability that an error bit is generated may increase. If an error bit is generated due to iterative reading, recovering data may be relatively difficult. The flash memory may perform a read reclaim operation to suppress and/or prevent this phenomenon.

A read reclaim operation is performed through a process of copying data in an old memory block to a new memory block. The process may be executed as a background operation without a command from a host. When a read command is received from the host, the process may be performed in parallel (or alternatively concurrently and/or simultaneously) with the read command. A series of operation times for the read reclaim operation including, for example, an erase time of a memory block, a read time for reading old data, a program time for programming a new memory block, etc. may be used to calculate a duration of an interface idle time interval associated with the read reclaim operation.

Referring to FIG. 13, in response to receiving a command CMD from the UFS host 2100, the UFS device 2200 calculates and/or estimates an erase time tERASE for a memory block of the flash memory 2210, a copyback time tCPBK for read reclaim, a first read time tR1 for reading first data DATA1, and a second read time tR2 for reading second data DATA2.

The UFS device 2200 calculates a duration of a first interface idle time interval based on the erase time tERASE, the copyback time tCPBK, and the first read time tR1.

The UFS device 2200 provides first interface idle time information to the UFS host 2100. The first interface idle time information includes the duration of the first interface idle time interval. The UFS device 2200 then performs the erase operation during the erase time tERASE, the copyback operation during the copyback time tCPBK, and the first read operation during the first read time tR1. In response to receiving the first interface idle time information, the UFS host 2100 switches the host interface 2101 from the active mode to a sleep mode.

After the first idle time interval expires, the UFS host 2100 switches the host interface 2101 from the sleep mode to the active mode, and the UFS device 2200 sends the read first data DATA1 to the UFS host 2100. When the UFS device 2200 outputs the first data DATA1, the UFS device 2200 also outputs second interface idle time information for the second read operation to the UFS host 2100. The second interface idle time information includes a duration of a second interface idle time interval calculated based on the second read time tR1 for reading the second data DATA2. In this example, the UFS device 2200 transfers the second interface idle time information using a DATA IN UPIU signal.

After the second interface idle time interval expires, the UFS host 2100 again switches the host interface 2101 interface from the sleep mode to the active mode, and the UFS device 2200 sends the read second data DATA2 to the UFS host 2100.

If the second interface idle time interval S1 (corresponding to a slashed portion in FIG. 13) is relatively short, the UFS host 2100 may not switch the host interface 2101 from the active mode to the sleep mode. For example, if the second interface idle time interval S1 is less than a threshold reference time, then the UFS host 2100 may forego switching the host interface 2101 from the active mode to the sleep mode and remain in the active mode.

Referring to FIG. 14, in response to receiving a host command CMD, the UFS device 2200 calculates an operation time of the flash memory 2210 corresponding to the host command CMD. For example, as illustrated in FIG. 14, the UFS device 2200 calculates and/or estimates a first read time tR1 for reading first data DATA1, an erase time tERASE, a copyback time tCPBK for a read reclaim operation, and a second read time tR2 for reading second data DATA2.

The UFS device 2200 provides the UFS host 2100 with first interface idle time information including a duration of a first interface idle time interval calculated based on the first read time tR1 for the first read operation, and the flash memory 2210 performs the first read operation to read the first data DATA1 during the first read time tR1. In response to the first interface idle time information, the UFS host 2100 switches the host interface 2101 from the active mode to the sleep mode.

After the first interface idle time interval expires, the UFS host 2100 switches the host interface 2101 from the sleep mode to the active mode, and the UFS device 2200 transfers the read first data DATA1 to the UFS host 2100. When the first data DATA1 is output, the UFS device 2200 also provides the UFS host 2100 with second interface idle time information. The second interface idle time information includes a duration of a second interface idle time interval calculated based on the erase time tERASE for the erase operation, the copyback time tCPBK for the copyback operation, and the second read time tR2 for the second read operation. Based on the second interface idle time information, the UFS host 2100 switches the host interface 2101 from the active mode to the sleep mode.

After the second interface idle time interval expires, the UFS host 2100 again switches the host interface 2101 from the sleep mode to the active mode, and the UFS device 2200 transfers the read second data DATA2 to the UFS host 2100.

As illustrated in FIG. 15, in response to receiving a command CMD, the flash memory 2210 sequentially performs a first read operation for reading the first data DATA1, a first copyback operation for a first read reclaim operation, a second read operation for reading the second data DATA2, and a second copyback operation for a second read reclaim operation.

In more detail, in response to the command CMD, the UFS device 2200 provides the UFS host 2100 with first interface idle time information. The first interface idle time information includes a duration of a first interface idle time interval calculated based on a read time tR1 for the first read operation, and performs the first read operation during the first read time tR1. Based on the first interface idle time information, the UFS host 2100 switches the host interface 2101 from the active mode to the sleep mode.

After the first interface idle time interval expires, the UFS host 2100 switches the host interface 2101 from the sleep mode to the active mode, and the UFS device 2200 transfers the read first data DATA1 to the UFS host 2100. When the UFS device 220 outputs the first data DATA1, the UFS device 2200 also provides the UFS host 2100 with second interface idle time information. The second interface idle time information includes a duration of a second interface idle time interval calculated based on a first copyback time tCPBK1 for the first copyback operation and a second read time tR2 for the second read operation. Based on the second interface idle time information, the UFS host 2100 switches the host interface 2101 from the active mode to the sleep mode.

After the second interface idle time interval expires, the UFS host 2100 again switches the host interface 2101 from the sleep mode to the active mode, and the UFS device 2200 transfers the read second data DATA2 to the UFS host 2100. When the UFS device 2200 transfers the read second data DATA2, the UFS device 2200 also provides the UFS host 2100 with third interface idle time information. The third interface idle time information includes a duration of a third interface idle time interval calculated based on the second copyback time tCPBK2 for the second copyback operation. Based on the third interface idle time information, the UFS host 2100 switches the host interface 2101 from the active mode to the sleep mode.

Interface Mode Switching when Additional Command of UFS Host Exists

Figure 16:
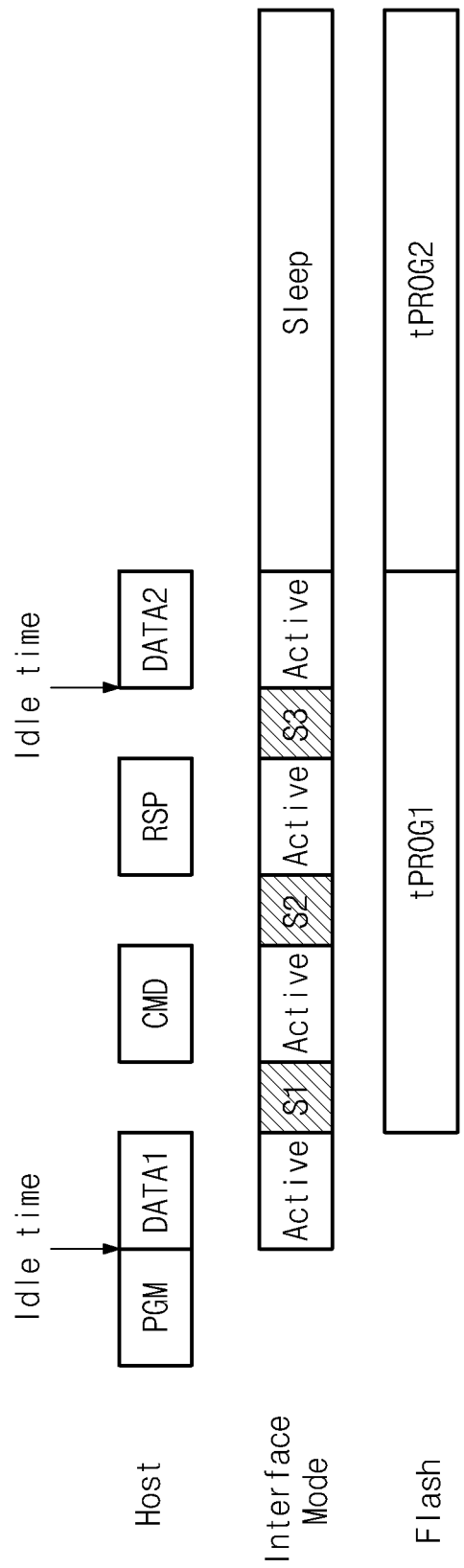
FIG. 16 is an example timing diagram schematically illustrating a method of switching an interface mode when an additional command of an UFS host exists.

FIG. 16 is an example timing diagram schematically illustrating an example embodiment of a method for switching an interface mode when an additional command of an UFS host exists.

A command requested by the UFS host 2100 may exist during interface idle time intervals calculated by the UFS device 2200. In this example, the UFS host 2100 may change a mode of an interface (e.g., from the active mode to the sleep mode and vice versa) more frequently to transfer commands and receive responses. Also, as compared to an interface idle time interval calculated by the UFS device 2200, actual interface idle time may be shorter due to the additional command from the UFS host 2100. In one example, the actual interface idle time may be substantially shorter due to a change in a mode of the interface.

If the actual interface idle time is substantially shorter due to the additional command, then the UFS system 2000 according to at least some example embodiments may skip or forego the switching of the mode of an interface. For example, if the actual interface idle time is shorter than a threshold reference time, then the interface may not be switched from the active mode to the sleep mode, but may remain in the active mode.

Referring to FIG. 16, in response to receiving the program command PGM from the UFS host 2100, the UFS device 2200 calculates and/or estimates a program time tPROG1 for programming first data DATA1. The UFS device 2200 provides first interface idle time information to the UFS host 2100. The first interface idle time information includes a duration of an interface idle time interval calculated based on the program time tPROG1.

In response to the first interface idle time information, the UFS host 2100 transfers the first data DATA1 to the UFS device 2200, and switches the host interface 2101 from the active mode to a sleep mode 51.

The UFS host 2100 then determines whether an additional command exists based on a check of the command queue 2131. If an additional command exists, the UFS host 2100 switches the host interface 2101 back to the active mode, and provides the command to the UFS device 2200. After issuing the command, the UFS host 2100 again switches the host interface 2101 from the active mode to a sleep mode S2.

The UFS host 2100 again switches the host interface 2101 to the active mode to receive a response RSP from the UFS device 2200. After receiving the response RSP, the UFS host 2100 again switches the host interface 2101 back to a sleep mode S3. In this example embodiment, the UFS host 2100 switches the mode of the host interface 2101 from the active mode to the sleep mode and vice versa during the first interface idle time interval so as to communicate with the UFS device 2200.

According to at least this example embodiment, the UFS system 2000 may skip a more frequent mode change due to an additional command. The flash memory may perform a program operation of first data DATA1 internally during a first program time tPROG1. If the actual interface idle time is relatively short due to an additional command and/or a response, the UFS system 2000 may forego switching the host interface 2101 from the active mode to the sleep mode, and may remain in the active mode. For example, the UFS host 2100 may forego switching the host interface 2101 to one or more of the sleep modes S1, S2 and S3.

When the first interface idle time interval expires, the UFS host 2100 switches the host interface 2101 from the sleep mode to the active mode if necessary. The UFS device 2200 then provides the UFS host 2100 with second interface idle time information. The second interface idle time information includes a duration of a second interface idle time interval calculated based on a second program time tPROG for programming the second data DATA2. In response to receiving the second interface idle time information, the UFS host 2100 sends the second data DATA2 to the UFS device 2200, and switches the host interface 2101 from the active mode to the sleep mode. In response to receiving the second data DATA2, the UFS device 2200 performs the second program operation during the second program time tPROG2.

Although the example embodiments described above with regard to FIGS. 4-16 are discussed with regard to switching of the host interface 2101 from the active mode to the sleep mode, it should be understood that the device interface 2201 may be switched in a similar manner at the control of the UFS host 2100 and/or the UFS device 2200. Because these operations are similar to those discussed above, a detailed discussion is omitted.

An interface mode switching method of the UFS system 2000 according to at least some example embodiments is applicable to other storage systems.

Figure 17:
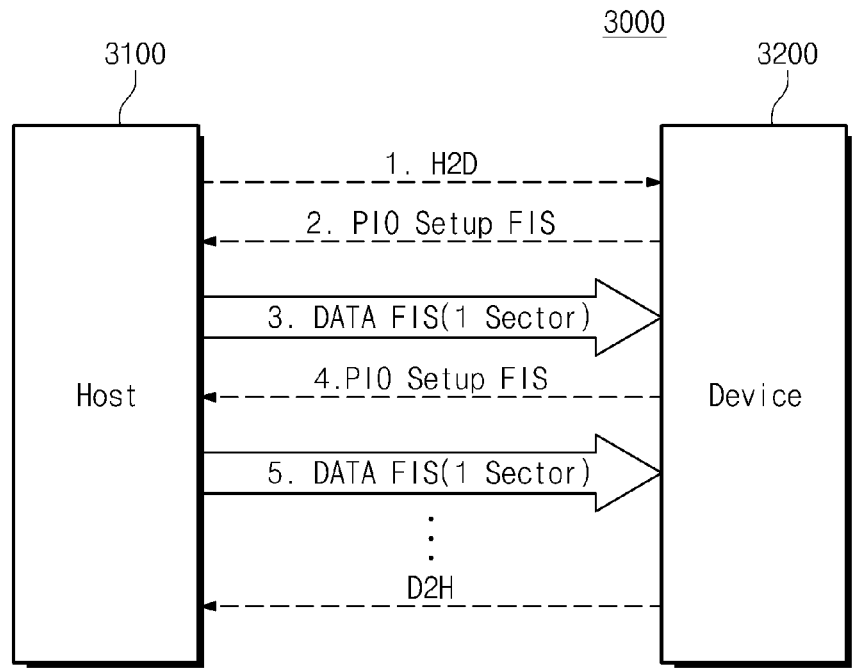
FIGS. 17 and 18 are block diagrams schematically illustrating example applications on a serial advanced technology attachment (SATA) system.
Figure 18:
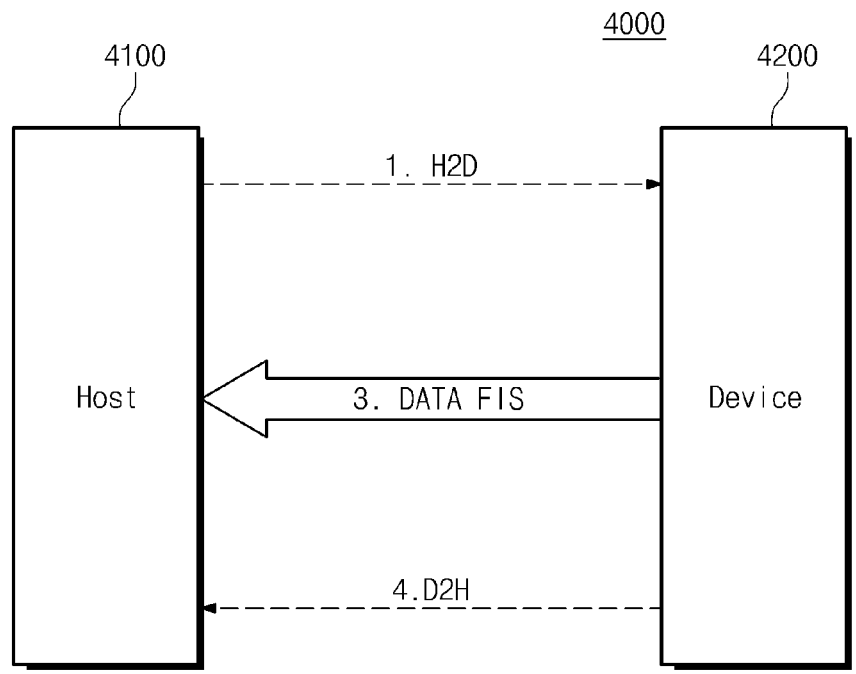

FIGS. 17 and 18 are block diagrams schematically illustrating example applications on a SATA system. FIG. 17 shows an example write operation of a SATA system 3000.

Referring to FIG. 17, the SATA system 3000 includes a host 3100 and a device 3200. In this example, the SATA system 3000 uses PIO Setup FIS for receiving data to be written. Idle time information calculated by the device 3200 is provided to the host 3100 using the PIO Setup FIS.

FIG. 18 shows an example read operation of a SATA system 4000.

Referring to FIG. 18, a SATA system 4000 provides a host 4100 with idle time information calculated by a device 4200 for a read operation using DATA FIS.

Meanwhile, a storage system according to at least some example embodiments may be applicable to an SAS. Idle time information may be transferred to a host using XFER_RDY frame at a write operation in a manner similar or substantially similar to UFS or SATA.

While inventive concepts have been described with reference to some example embodiments, it will be apparent to those skilled in the art that various changes and modifications may be made without departing from the spirit and scope of this disclosure. Therefore, it should be understood that the above example embodiments are not limiting, but illustrative.

What is claimed is:

1. A memory storage device comprising:
    a device controller configured to generate interface idle time information in response to a command received from a host, the interface idle time information being determined based on an estimated time to execute at least one operation at the memory storage device; and
    a device interface configured to output the interface idle time information to the host.

2. The memory storage device of claim 1, wherein the at least one operation corresponds to the command received from the host.

3. The memory storage device of claim 1, wherein the command is one of a read command, a program command and an erase command.

4. The memory storage device of claim 1, wherein the command is an interface idle time information request command requesting the interface idle time information from the memory storage device.

5. The memory storage device of claim 4, wherein the at least one operation includes at least one of a read operation, a program operation and an erase operation.

6. The memory storage device of claim 1, wherein the at least one operation includes at least one of a read operation, a program operation and an erase operation.

7. The memory storage device of claim 1, further comprising:
    a non-volatile memory;
    a buffer memory; and wherein
    the device controller is further configured to control the buffer memory and the non-volatile memory to execute the at least one operation.

8. The memory storage device of claim 7, wherein the non-volatile memory is a flash memory.

9. The memory storage device of claim 1, wherein the interface idle time information includes a duration of an interface idle time interval during which at least one of a host interface and the device interface is in a sleep mode.

10. The memory storage device of claim 9, wherein both the host interface and the device interface are in the sleep mode during the interface idle time interval.

11. The memory storage device of claim 9, wherein memory storage device executes the at least one operation during the interface idle time interval.

12. The memory storage device of claim 9, wherein the sleep mode is a low power mode.

13. A method of operating a memory storage device, the method comprising:
    generating interface idle time information in response to a command received from a host, the interface idle time information being determined based on an estimated time to execute at least one operation at the memory storage device; and
    outputting the interface idle time information to the host.

14. The method of claim 13, wherein the at least one operation corresponds to the command received from the host.

15. The method of claim 13, wherein the command is one of a read command, a program command and an erase command.

16. The method of claim 13, further comprising:
receiving an interface idle time information request command requesting the interface idle time information from the memory storage device.

17. The method of claim 13, wherein the at least one operation includes at least one of a read operation, a program operation and an erase operation.

18. A universal flash storage (UFS) device comprising:
a plurality of flash memories;
a device controller configured to generate interface idle time information in response to a command received from a UFS host, the interface idle time information being determined based on an estimated time to execute at least one operation at the UFS device, and the device controller being further configured to control the plurality of flash memories to execute the at least one operation; and
a device interface configured to output the interface idle time information to the UFS host.

19. The UFS device of claim 18, wherein:
the interface idle time information includes a duration of an interface idle time interval during which at least one interface is in a sleep mode; and
the device controller includes,
a command manager configured to calculate a time to execute the at least operation at the UFS device, and to calculate the duration of the interface idle time interval based on the calculated time to execute the at least one operation.

20. The UFS device of claim 19, wherein the device controller further includes:
a buffer manager configured to control a buffer memory;
a flash translation layer configured to provide mappings between virtual and physical storage locations of the plurality of flash memories;
a flash manager configured to interface with the flash translation layer and the plurality of flash memories, the flash manager being further configured to store data in the plurality of flash memories based on address mapping information;
a flash dynamic memory access configured to interface with the plurality of flash memories, the flash dynamic memory access being configured to provide data from the buffer memory to the flash manager; and
a device dynamic memory access configured to interface with the buffer memory, the device interface and the command manager.

* * * * *